United States Patent
Gilsdorf et al.

(10) Patent No.: US 7,262,667 B2
(45) Date of Patent: Aug. 28, 2007

(54) RADIO FREQUENCY POWER AMPLIFIER

(75) Inventors: Benjamin R. Gilsdorf, Phoenix, AZ (US); Gilles Montoriol, Tournefeuille (FR); David A. Newman, Tempe, AZ (US); Jacques Trichet, Cugnaux (FR)

(73) Assignee: Freescale Semiconductor, Inc., Austin, TX (US)

( * ) Notice: Subject to any disclaimer, the term of this patent is extended or adjusted under 35 U.S.C. 154(b) by 394 days.

(21) Appl. No.: 10/970,098

(22) Filed: Oct. 20, 2004

(65) Prior Publication Data

US 2006/0084403 A1    Apr. 20, 2006

(51) Int. Cl.
    *H03F 1/52* (2006.01)
(52) U.S. Cl. .................... 330/298; 330/207 P; 330/296
(58) Field of Classification Search .................... None
    See application file for complete search history.

(56) References Cited

U.S. PATENT DOCUMENTS 6,137,366 A * 10/2000 King ........................ 330/298
6,496,052 B1   12/2002 Chiu
6,750,722 B2    6/2004 Newman et al.
6,998,920 B2 *  2/2006 Krutko et al. ............... 330/298

OTHER PUBLICATIONS

U.S. Appl. No. 10/424,251, filed Apr. 28, 2003 entitled, "Power Amplifier and Method Thereof".

* cited by examiner

*Primary Examiner*—Khanh Van Nguyen
(74) *Attorney, Agent, or Firm*—Ingrassia Fisher & Lorenz

(57) ABSTRACT

A radio frequency (RF) power amplification circuit including a power amplifier is provided for preventing breakdown of the power amplifier. The power amplifier includes an input for receiving RF signals and an output for providing amplified RF signals. The RF power amplification circuit also includes a bias circuit coupled to the input of the power amplifier to permit normal operation of the power amplifier when the base current is below a predetermined current threshold and to prevent normal operation of the power amplifier when the base current is above the predetermined current threshold.

11 Claims, 2 Drawing Sheets

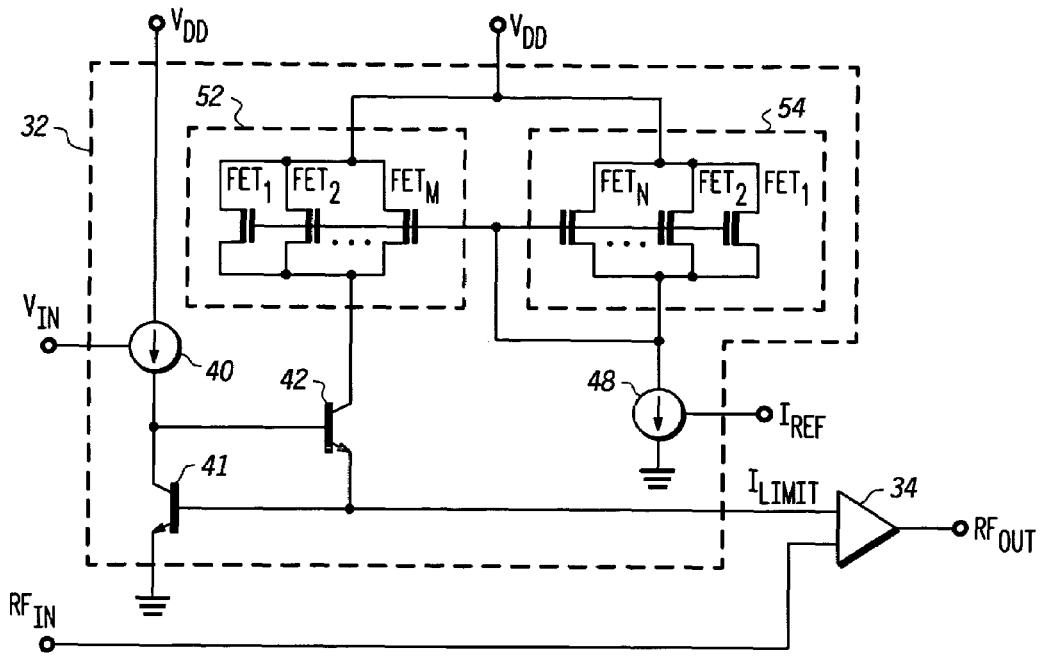
*FIG. 3*
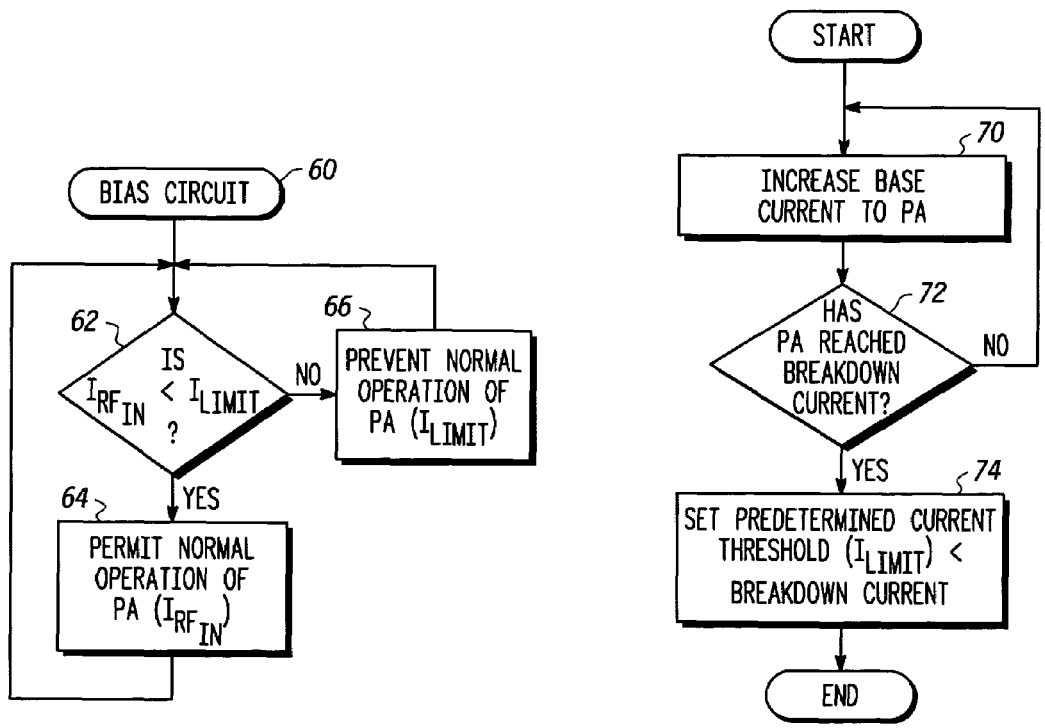
*FIG. 4*     *FIG. 5*

RADIO FREQUENCY POWER AMPLIFIER

FIELD OF THE INVENTION

The present invention generally relates to power amplifiers, and more particularly relates to a method and apparatus for a more robust radio frequency (RF) power amplifier.

BACKGROUND OF THE INVENTION

Radio frequency (RF) power amplifiers are utilized to boost the RF signals in order to transmit them in wireless applications such as cellular phones. However, such wireless applications may temporarily place the RF power amplifiers in high power conditions. When RF power amplifiers are subjected to load mismatch during these high power conditions, the base current, i.e., the current at the input to the power amplifiers, increases more than would be required under normal conditions. This increase in base current under such high power conditions decreases the reliability of the RF power amplifiers and may cause the failure of the RF amplifiers.

Accordingly, it is desirable to limit the base current of the RF power amplifier to enhance its ruggedness. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A radio frequency (RF) power amplification circuit including a power amplifier is provided for preventing failure of the power amplifier. The power amplifier includes an input for receiving RF signals and an output for providing amplified RF signals. The RF power amplification circuit also includes a bias circuit coupled to the input of the power amplifier to permit normal operation of the power amplifier when the base current is below a predetermined current threshold and to prevent normal operation of the power amplifier when the base current is above the predetermined current threshold.

A method is provided for controlling a RF power amplification circuit. The RF power amplification circuit includes a power amplifier with a base current, the power amplifier having an input for receiving RF signals and an output for providing amplified RF signals. The power amplification circuit also includes a bias circuit coupled to the input of the power amplifier for controlling the operation of the power amplifier. The method includes the steps of determining whether the base current is below a predetermined current threshold and controlling operation of the power amplifier by permitting normal operation of the power amplification circuit when the base current is below the predetermined current threshold and by preventing normal operation of the power amplification circuit when the base current is above the predetermined current threshold.

BRIEF DESCRIPTION OF THE DRAWINGS

The present invention will hereinafter be described in conjunction with the following drawing figures, wherein like numerals denote like elements.

FIG. 3 is a circuit diagram of a power amplification circuit of the portable electronic device in accordance with an alternate embodiment of the present invention;

FIG. 4 is a flowchart of the operation of the power amplification circuit in accordance with the preferred embodiment of the present invention; and FIG. 5 is a flowchart of the calculation of the predetermined current threshold of the power amplification circuit in accordance with the preferred embodiment of the present invention.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
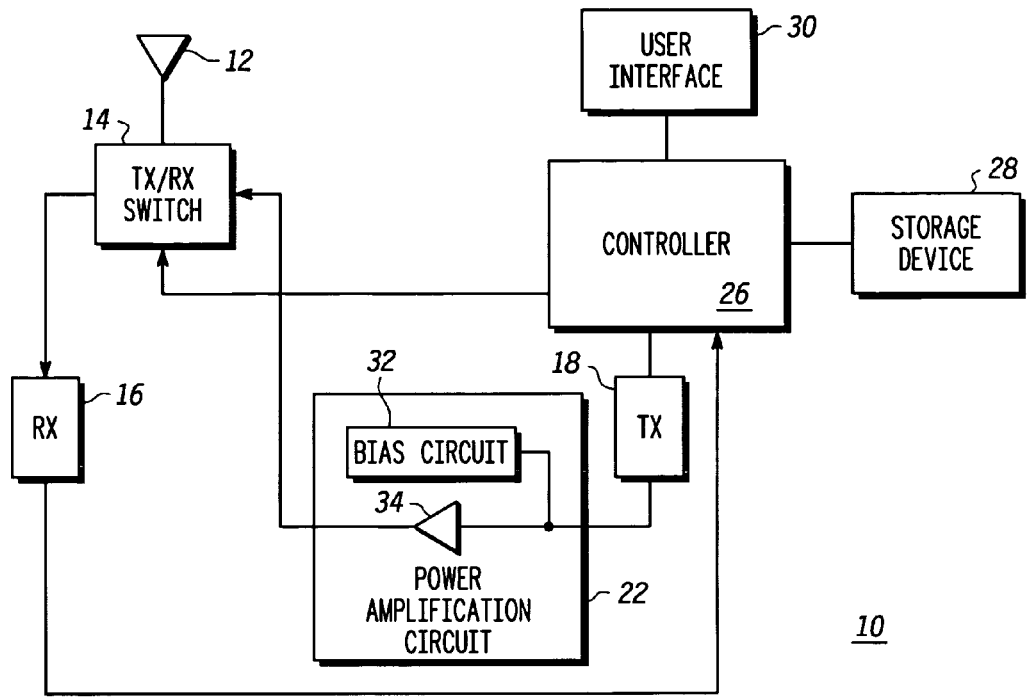
FIG. 1 is a block diagram of a portable electronic device in accordance with the preferred embodiment of the present invention.

Referring to FIG. 1, a portable electronic device 10 in accordance with the preferred embodiment of the present invention includes an antenna 12 for receiving radio frequency (RF) signals. The antenna 12 is coupled to a receive/transmit switch 14 for controlling the flow of RF signals to and from the antenna 12. When the switch 14 is in the receive position, RF signals received by the antenna 12 flow to receiver circuitry 16 for demodulation and decoding of the RF signals. The decoded signals are then provided to a controller 26 for utilization thereby, the controller 26 comprising a number of circuits and/or devices to perform the functions of the portable electronic device 10. The controller 26 is typically coupled to a storage device 28, such as one or more volatile and/or nonvolatile memory devices for facilitating operation of the portable electronic device 10. In addition, the controller 26 is typically coupled to user interfaces 30, such as microphones, speakers, displays or input keys, appropriate to the function of the portable electronic device 10. Also, the controller 26 is coupled to the receive/transmit switch 14 for controlling the operation thereof.

When information is to be transmitted from the portable electronic device 10, the controller 26 provides the information to transmitter circuitry 18 for encoding and modulation of the information to derive RF signals. The output of the transmitter circuitry 18 is coupled to an input of a power amplification circuit 22 for amplification of the RF signals ($RF_{in}$). The output of the power amplification circuit 22 provides amplified RF signals ($RF_{in}$) to the switch 14, which the controller 26 has placed in the transmit position, and thence to the antenna 12 for transmission therefrom.

In accordance with the preferred embodiment of the present invention, the power amplification circuit 22 includes a bias circuit 32 coupled to an RF power amplifier 34 for controlling the operation thereof. The RF power amplifier 34 amplifies the RF signals sufficient for transmission from the antenna 12. In operation, the RF power amplifier 34 has an operational voltage and is customarily chosen to have operational characteristics of ruggedness and reliability such as a heterojunction bipolar transistor (HBT) power amplifier. HBT power amplifiers tend to have very low leakage current in the off-state. In addition, HBT power amplifiers have excellent linearity suitable for cellular CDMA and W-CDMA RF signals.

The presence of certain types of load mismatch conditions can affect the device current and voltage of the RF power amplifier 34 thereby affecting the reliability and, possibly, causing a failure of the RF power amplifier 34. The safe operating current of the RF power amplifier 34 is inversely proportional to the supply voltage of the RF power amplifier 34, so limiting the base current, i.e., the current at the input of the RF power amplifier 34, limits the operational current of the RF power amplifier 34 thereby preventing its failure.

Therefore, in accordance with the preferred embodiment of the present invention, the bias circuit 32 is coupled to the base current at the input of the RF power amplifier 34 to limit the base current of the RF power amplifier 34 by providing a limiting current to the RF power amplifier 34. In operation, the bias circuit 32 is coupled to the base current of the power amplifier 34 and is designed to provide the limiting current thereto at a predetermined current threshold such that the bias circuit 32 permits normal operation of the RF power amplifier 34 when the base current is below the predetermined current threshold and to prevent normal operation of the RF power amplifier 34 when the base current is above the predetermined current threshold.

Figure 2:
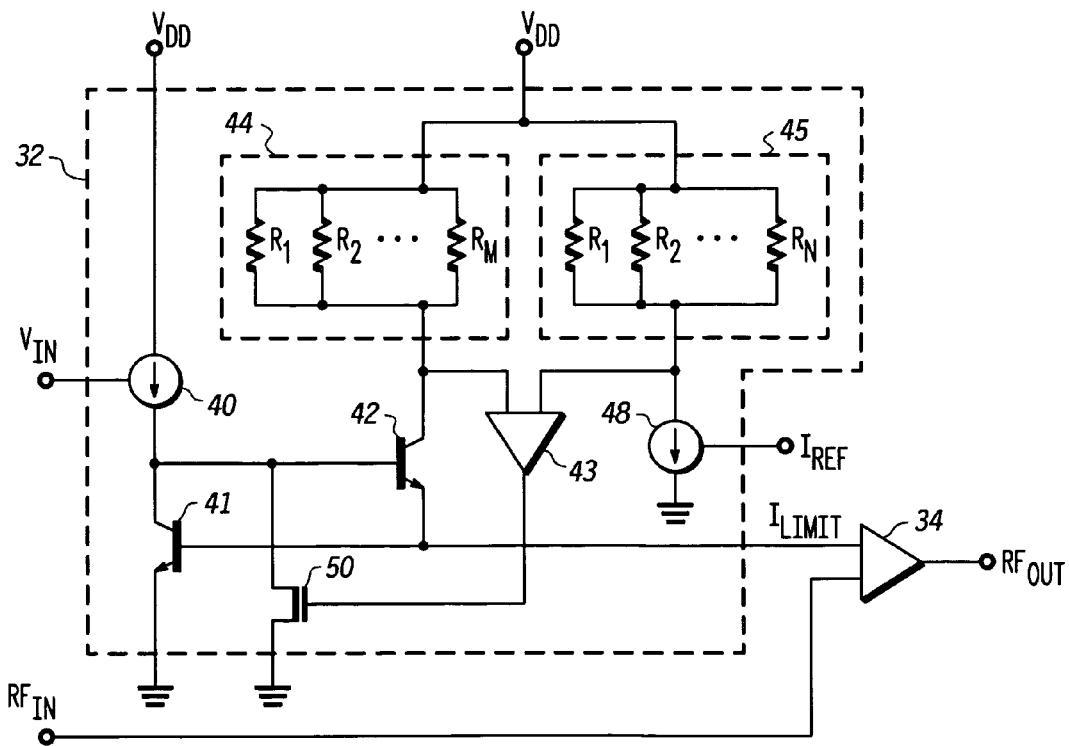
FIG. 2 is a circuit diagram of a power amplification circuit of the portable electronic device in accordance with the preferred embodiment of the present invention.

Referring next to FIG. 2, a circuit diagram of the power amplification circuit 22 of the portable electronic device 10 in accordance with the preferred embodiment of the present invention is shown. The power amplifier 34 has a first input for receiving the RF signals from the transmitter circuitry 18 (FIG. 1), $RF_{in}$, and an output for providing the amplified signals, $RF_{out}$, to the antenna 12. A second input to the power amplifier 34 receives the current limiting signal from the bias circuit 32, $I_{LIMIT}$.

The bias circuit 32 includes a bias current source 40, providing $I_{BIAS}$, and a transistor 41 coupled in series between operational voltage $V_{dd}$ and ground. The node between the bias current source 40 and the transistor 41 is coupled to the base of transistor 42 for control thereof. An operational amplifier 43 has a first input coupled to transistor 42 and to operational voltage $V_{dd}$ via resistive element 44. Resistive element 44 includes M number of equal value resistors, $R_1, R_2, \ldots R_M$, coupled in parallel. The second input of the operational amplifier 43 is also coupled to operational voltage $V_{dd}$ via resistive element 45 and is coupled to reference current source 48, providing $I_{REF}$. Resistive element 45 includes N number of equal value resistors, $R_1, R_2, \ldots R_N$, coupled in parallel. The output of the operational amplifier 43 is coupled to the base of transistor 50 which is coupled between the base of transistor 42 and ground. The collector of transistor 42 is coupled to the base of transistor 41 and the second input to the power amplifier 34.

In operation, the bias circuit 32 provides a limiting current, $I_{LIMIT}$, to the second input of the power amplifier 34. The value of $I_{LIMIT}$, which is the predetermined current threshold, is defined by the bias circuit as follows:

$$(M/N) \times I_{REF} = I_{LIMIT}$$

where M and N are the number of equal value resistors coupled in parallel in resistive elements 44 and 45, respectively, and $I_{REF}$ is the reference current provided by reference current source 48.

As described below in connection with FIG. 5, the predetermined current threshold, $I_{LIMIT}$, is determined and the reference current, $I_{REF}$, of the reference current source 48 and the number of resistors to couple in parallel for resistive elements 44 and 45, are derived therefrom.

Referring next to FIG. 3, a circuit diagram of the power amplification circuit 22 of the portable electronic device 10 in accordance with an alternate embodiment of the present invention is shown. The structure of the bias circuit 32, in accordance with the alternate embodiment of the present invention, includes two resistive elements 52 and 54. Resistive element 52 includes M number of equal value field effect transistors, $FET_1, FET_2, \ldots FET_M$, coupled in parallel, while resistive element 54 includes N number of equal value resistors, $FET_1, FET_2, \ldots FET_N$, coupled in parallel. The gates of all of the transistors of resistive elements 52 and 54 are coupled gate to gate and the reference current source 48 is coupled thereto. The value of $I_{LIMIT}$, which is the predetermined current threshold, is defined by the same formula as set out in the description of FIG. 2.

Referring to FIG. 4, a flowchart of the operation of the bias circuit 32 is shown. In accordance with the present invention, the bias circuit 32 is coupled to the input of the power amplifier 34. Thus, the base current of the power amplifier 34, $I_{RFin}$, is coupled to the bias circuit 32. Bias circuit operation begins at step 60 by determining 62 whether the base current, $I_{RFin}$, is below the predetermined current threshold, $I_{LIMIT}$, of the bias circuit 32. If the base current is below the predetermined current threshold, normal operation of the power amplifier 34 is permitted by providing $I_{RFin}$ to the input thereof at step 64. If, on the other hand, the base current is not below the predetermined current threshold, normal operation of the power amplifier 34 is prevented by providing the limiting current $I_{LIMIT}$ to the input thereof at step 64. It can be seen that when normal operation is being prevented by limiting the base current to $I_{LIMIT}$, normal operation will return after the base current drops below the predetermined threshold current.

Referring next to FIG. 5, a flowchart of the calculation of the predetermined threshold current is shown. The power amplifier 34 has a breakdown current which is the current at which the power amplifier will fail. Prior to design of the bias circuit 32, the predetermined current threshold is calculated by increasing the base current to the power amplifier input at step 70 and determining 72 whether the power amplifier has failed, i.e., whether the base current equals or exceeds the breakdown current. If it is determined 72 that the power amplifier has not failed, the base current is increased at step 70 and another determination 72 is made. When it is determined 72 that the power amplifier has failed, the predetermined current threshold, $I_{LIMIT}$, is set to a level less than the breakdown current. Thus, in accordance with the preferred embodiment depicted in FIG. 2, the elements of the bias circuit 32 are chosen such that the ratio of the number of resistors in resistive elements 44 and 45 and the reference current, $I_{REF}$, is equal to $I_{LIMIT}$.

Thus, it can be seen that an improved power amplification circuit 22 is provided which limits the base current of a power amplifier 34 to prevent normal operation thereof when the base current exceeds a predetermined current threshold, $I_{LIMIT}$. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A radio frequency (RF) power amplification circuit, comprising:
   a power amplifier having a base current and including a first input for receiving RF signals, a second input, and an output for providing amplified RF signals therefrom; and
   a bias circuit coupled to the second input to permit normal operation of the power amplifier when the base current is below a predetermined current threshold and to prevent normal operation of the power amplifier when the base current is above the predetermined current threshold.

2. The RF power amplification circuit of claim 1 wherein the power amplifier comprises a heterojunction bipolar transistor (HBT) power amplifier.

3. The RF power amplification circuit of claim 1 wherein the bias circuit prevents normal operation of the power amplification circuit by limiting the base current from increasing above the predetermined current threshold.

4. The RF power amplification circuit of claim 3 wherein the bias circuit is coupled to the second input of the power amplifier and wherein the bias circuit limits the base current of the power amplifier by providing a limiting current to the second input of the power amplifier.

5. A method for controlling a radio frequency (RF) power amplification circuit comprising a power amplifier with a base current and having a first input for receiving RF signals, a second input, and an output for providing amplified RF signals therefrom and a bias circuit coupled to the second input of the power amplifier for controlling the operation thereof, the method comprising the steps of:
   determining whether the base current is below a predetermined current threshold; and
   controlling operation of the power amplifier by permitting normal operation of the power amplification circuit when the base current is below the predetermined current threshold and by preventing normal operation of the power amplification circuit when the base current is above the predetermined current threshold.

6. The method of claim 5 wherein the power amplifier has a breakdown current, the method further comprising the step of calculating the predetermined current threshold in response to the breakdown current of the power amplifier.

7. The method of claim 5 wherein the step of controlling the operation of the power amplifier comprises the step of controlling the operation of the power amplifier by limiting the base current of the power amplifier when the base current is above the predetermined current threshold.

8. The method of claim 7 wherein the bias circuit is coupled to the second input of the power amplifier and wherein the step of limiting the base current of the power amplifier comprises providing a limiting current to the second input of the power amplifier.

9. A portable electronic device comprising:
   a radio frequency (RF) receiver for receiving RF signals;
   a power amplifier with a power amplifier current and having a first input coupled to the RF receiver for receiving the RF signals, a second input, and an output for providing amplified RF signals; and
   a bias circuit coupled to the second input of the power amplifier to permit normal operation of the power amplifier when the power amplifier current is below a predetermined current threshold and to prevent normal operation of the power amplifier when the power amplifier current is above the predetermined current threshold.

10. The portable electronic device of claim 9 wherein the power amplifier further includes a base current, and wherein the bias circuit prevents normal operation of the power amplifier by limiting the base current of the power amplifier.

11. The portable electronic device of claim 10 wherein the bias circuit limits the base current of the power amplifier by providing a limiting current to the second input of the power amplifier.

* * * * *